(12) United States Patent
Kim et al.

(10) Patent No.: US 11,706,959 B2
(45) Date of Patent: Jul. 18, 2023

(54) TESTING STRUCTURE AND DISPLAY DEVICE INCLUDING THE SAME

(71) Applicant: Samsung Display Co., Ltd., Yongin-si (KR)

(72) Inventors: Kwangmin Kim, Yongin-si (KR); Wonkyu Kwak, Yongin-si (KR); Joongsoo Moon, Yongin-si (KR); Jieun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 283 days.

(21) Appl. No.: 17/089,958

(22) Filed: Nov. 5, 2020

(65) Prior Publication Data

US 2021/0057514 A1 Feb. 25, 2021

Related U.S. Application Data

(62) Division of application No. 15/867,956, filed on Jan. 11, 2018, now Pat. No. 10,861,922.

(30) Foreign Application Priority Data

Aug. 17, 2017 (KR) .................. 10-2017-0104143

(51) Int. Cl.
*H10K 59/131* (2023.01)
*H10K 59/121* (2023.01)
(Continued)

(52) U.S. Cl.
CPC ....... *H10K 59/131* (2023.02); *H10K 59/1213* (2023.02); *G09G 3/006* (2013.01); *H10K 71/70* (2023.02)

(58) Field of Classification Search
CPC ............. H01L 27/3262; H01L 27/3258; H01L 27/3276; G09G 3/006; H10K 59/1213; H10K 59/124; H10K 59/131
See application file for complete search history.

(56) References Cited

U.S. PATENT DOCUMENTS 6,194,837 B1  2/2001  Ozawa ................. G09G 3/3225
                                                     313/506
8,891,264 B1  11/2014  Cleeves .............. H01L 27/0266
                                                     257/655
(Continued)

FOREIGN PATENT DOCUMENTS

KR   1020150062356 A   6/2015
KR   1020160017845 A   2/2016
(Continued)

OTHER PUBLICATIONS

Xiaobin et al., "Application of a new-type hight-voltage live display device in a power distribution device", Digital Technology and Applications, China Academic Journal Electronic Publishing House, Oct. 31, 2016.

*Primary Examiner* — Didarul A Mazumder
*Assistant Examiner* — Gustavo G Ramallo
(74) *Attorney, Agent, or Firm* — Cantor Colburn LLP

(57) ABSTRACT

A display device is provided. The display device includes: a substrate including a display area including pixels at which an image is displayed and a peripheral area at which the image is not displayed, the peripheral area disposed outside the display area. In the peripheral area, the display device further includes: a plurality of thin film transistors connected to the pixels and with which operation of the pixels is tested, the thin film transistors including gate electrodes arranged separated from each other on the substrate; and a bridge wiring electrically connecting adjacent gate electrodes of the plurality of thin film transistors to each other.

8 Claims, 11 Drawing Sheets

(51) Int. Cl.
    *G09G 3/00*           (2006.01)
    *H10K 71/70*       (2023.01)

(56) References Cited

U.S. PATENT DOCUMENTS

| | | |
|---|---|---|
| 9,129,927 B2 | 9/2015 | Cupta et al. |
| 9,147,723 B1 | 9/2015 | Lee ................ G09G 3/006 |
| 9,356,087 B1 | 5/2016 | Lee et al. |
| 9,520,457 B2 | 12/2016 | So et al. |
| 9,653,368 B2 | 5/2017 | Kwak et al. |
| 9,722,002 B2 | 8/2017 | Kim et al. |
| 9,852,686 B2 | 12/2017 | So et al. |
| 2004/0160167 A1 | 8/2004 | Arai ................ G09G 3/006 |
| | | 313/500 |
| 2006/0103410 A1 | 5/2006 | Jeon ................ G09G 3/006 |
| | | 324/760.02 |
| 2007/0182442 A1 | 8/2007 | Hata ................ G09G 3/006 |
| | | 324/750.3 |
| 2013/0009241 A1 | 1/2013 | Matsuda ........... H01L 29/4238 |
| | | 257/331 |
| 2015/0144915 A1 | 5/2015 | Lee ................ G02F 1/1309 |
| | | 257/40 |
| 2016/0260367 A1* | 9/2016 | Kwak ................ G09G 3/3291 |
| 2017/0168330 A1* | 6/2017 | Wang ................ G01R 31/2825 |
| 2018/0102398 A1* | 4/2018 | Jeong ................ H01L 28/90 |

FOREIGN PATENT DOCUMENTS

| | | |
|---|---|---|
| KR | 1020160082770 A | 7/2016 |
| KR | 1020160087458 A | 7/2016 |
| KR | 1020160101737 A | 8/2016 |
| KR | 1020160108639 A | 9/2016 |
| KR | 1020170038345 A | 4/2017 |
| KR | 1020170093869 A | 8/2017 |

\* cited by examiner

TESTING STRUCTURE AND DISPLAY DEVICE INCLUDING THE SAME

This application is a divisional application of U.S. application Ser. No. 15/867,956 filed Jan. 11, 2018, which claims priority to Korean Patent Application No. 10-2017-0104143, filed on Aug. 17, 2017, and all the benefits accruing therefrom under 35 U.S.C. § 119, the content of which in its entirety is herein incorporated by reference.

BACKGROUND

1. Field

One or more embodiments relate to a display device, and more particularly, to a display device which may minimize occurrence of defect in a circuit during a manufacturing process.

2. Description of the Related Art

Generally, a display device includes a display area, and plural pixels are arranged inside the display area. When defect occurs in a circuit of the display device, the quality of an image produced at the pixels by the display device may deteriorate. Therefore, minimizing occurrence of a defect in a circuit or minimizing a defect occurrence rate of a circuit during a manufacturing process is desired.

However, in the case of a display device and manufacturing method thereof according to a related art, a relatively large number of defects occur in a circuit during a manufacturing process.

SUMMARY

One or more embodiments include a display device which may minimize occurrence of defect in a circuit during a manufacturing process.

According to one or more embodiments, a display device includes: a substrate including a display area including pixels at which an image is displayed and a peripheral area at which the image is not displayed, the peripheral area disposed outside the display area; and in the peripheral area, a plurality of thin film transistors electrically connected to the pixels in the display area and with which operation of the pixels is tested, the thin film transistors including gate electrodes arranged separated from each other on the substrate; and a bridge wiring electrically connecting adjacent gate electrodes of the plurality of thin film transistors to each other.

Each of the plurality of thin film transistors may include a source electrode and a drain electrode, and the bridge wiring may include a same material as that of the source electrodes and the drain electrodes.

Each of the plurality of thin film transistors may include a source electrode and a drain electrode, and the bridge wiring may be in a same layer as the source electrodes and the drain electrodes.

The gate electrodes and the bridge wiring may be arranged on a virtual line extended in one direction.

The bridge wiring may be a conductive layer which is formed as one body and connect at least three gate electrodes of at least three sequential thin film transistors to each other.

The at least three gate electrodes of the at least three thin film transistors and the conductive layer formed as one body may be are arranged on a virtual line extending in one direction.

The display device may further include an insulating layer between the gate electrodes of the plurality of thin film transistors and the bridge wiring, and the bridge wiring may contact the gate electrodes through contact holes in the insulating layer.

The display device may further include a plurality of data lines disposed in the display area and electrically connected to the pixels, the plurality of data lines extending from the display area to the peripheral area, and each of the plurality of thin film transistors may be electrically connected to a corresponding data line among the plurality of data lines.

Each of the plurality of thin film transistors may include a source electrode and a drain electrode, and the plurality of data lines extended from the display area to the peripheral area may include a same material as that of the source electrodes and the drain electrodes.

Each of the plurality of thin film transistors may include a source electrode and a drain electrode, and the plurality of data lines may comprise a same material as that of the source electrodes and the drain electrodes of the plurality of thin film transistors.

The display device may further include connection wirings connecting the plurality of data lines to corresponding one of the plurality of thin film transistors.

The connection wirings may include a same material as that of the gate electrodes.

The connection wirings may be arranged in in a same layer as the gate electrodes of the plurality of thin film transistors.

The display device may further include a plurality of output pads each of which locates over and contacts corresponding one of the connection wirings.

The plurality of output pads may comprise a same material as that of the source electrodes and the drain electrodes of the plurality of thin film transistors.

The plurality of output pads may be arranged in a same layer as the source electrodes and the drain electrodes are arranged.

The display device may further include a plurality of input pads arranged at a side of the plurality of thin film transistors. The side may be opposite to that at which the plurality of output pads are arranged.

The plurality of input pads may include a same material as that of the source electrodes and the drain electrodes.

The plurality of input pads may be arranged in a same layer as the source electrodes and the drain electrodes of the plurality of thin film transistors.

The plurality of input pads may extend in a direction away from the plurality of thin film transistors, and at respective ends of the plurality of input pads closest to the plurality of thin film transistors, the display device may further include a step difference adjustor arranged between the substrate and each of the plurality of input pads.

The step difference adjustor may include a same material as that of the gate electrodes.

The step difference adjustor may be arranged in a same layer as the gate electrodes of the plurality of thin film transistors.

The display device may further include a driving chip, the driving chip including input terminals electrically connected to the input pads and output terminals electrically connected to the output pads.

The display device may further include a printed circuit board. The plurality of input pads may extend in a direction away from the plurality of thin film transistors, and at respective ends of the plurality of input pads furthest from the plurality of thin film transistors, the printed circuit board may be electrically connected to the plurality of input pads.

According to one or more embodiments, a display device includes: a substrate including a display area including pixels at which an image is displayed and a peripheral area at which the image is not displayed, the peripheral area disposed outside the display area; and in the peripheral area, the display device further includes: a plurality of electrode pairs connected to the pixels in the display area, each of the plurality of electrode pairs including a source electrode and a drain electrode spaced apart from each other in a first direction; and a gate line lengthwise extending in a second direction crossing the first direction, the gate line passing between the source electrode and the drain electrode of each of the plurality of electrode pairs. The gate line passing between the source electrode and the drain electrode of each of the plurality of electrode pairs includes: first conductive layers spaced apart from each other in the second direction, and second conductive layers alternately arranged with the first conductive layers along the second direction.

The display device may further include a plurality of semiconductor layers connected to the plurality of electrode pairs.

The gate line passing between the source electrode and the drain electrode of each of the plurality of electrode pairs may pass over the plurality of semiconductor layers.

The first conductive layers may be arranged in a layer different from a layer in which the second conductive layers are arranged.

The first conductive layers spaced apart from each other may be electrically connected to each other by the second conductive layers.

According to one or more embodiment, a display device which may minimize occurrence of defect in a circuit during a manufacturing process may be implemented. The scope of the present disclosure is not limited by this effect.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
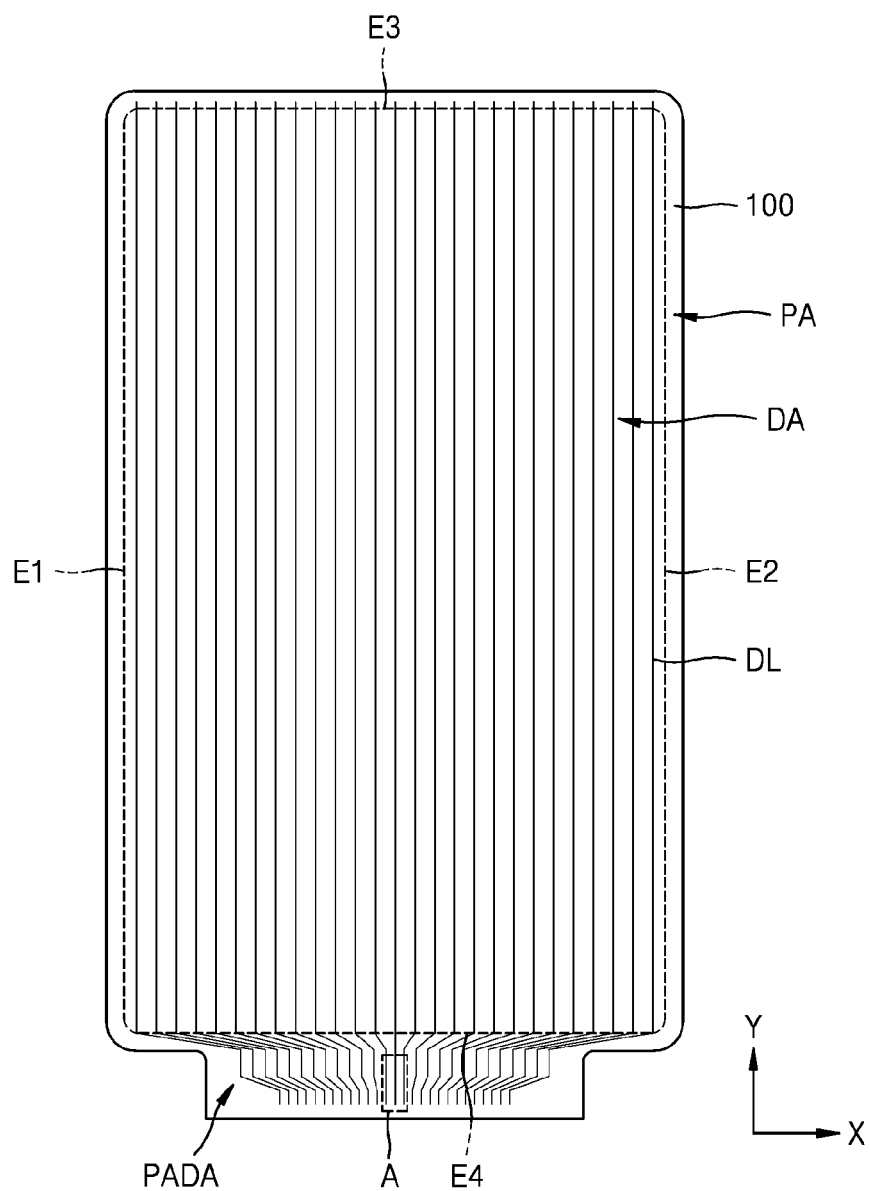
FIG. 1 is a top plan view of an exemplary embodiment of a portion of a display device in a manufacturing process according to the invention.

As the disclosure allows for various changes and numerous embodiments, example embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will be omitted.

It will be understood that when a component, such as a layer, a film, a region, or a plate, is referred to as being related to another component such as being "on" another component, the component can be directly on the other component or intervening components may be present thereon. In contrast, when a component, such as a layer, a film, a region, or a plate, is referred to as being related to another component such as being "directly on" another component, no intervening components are present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can, therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
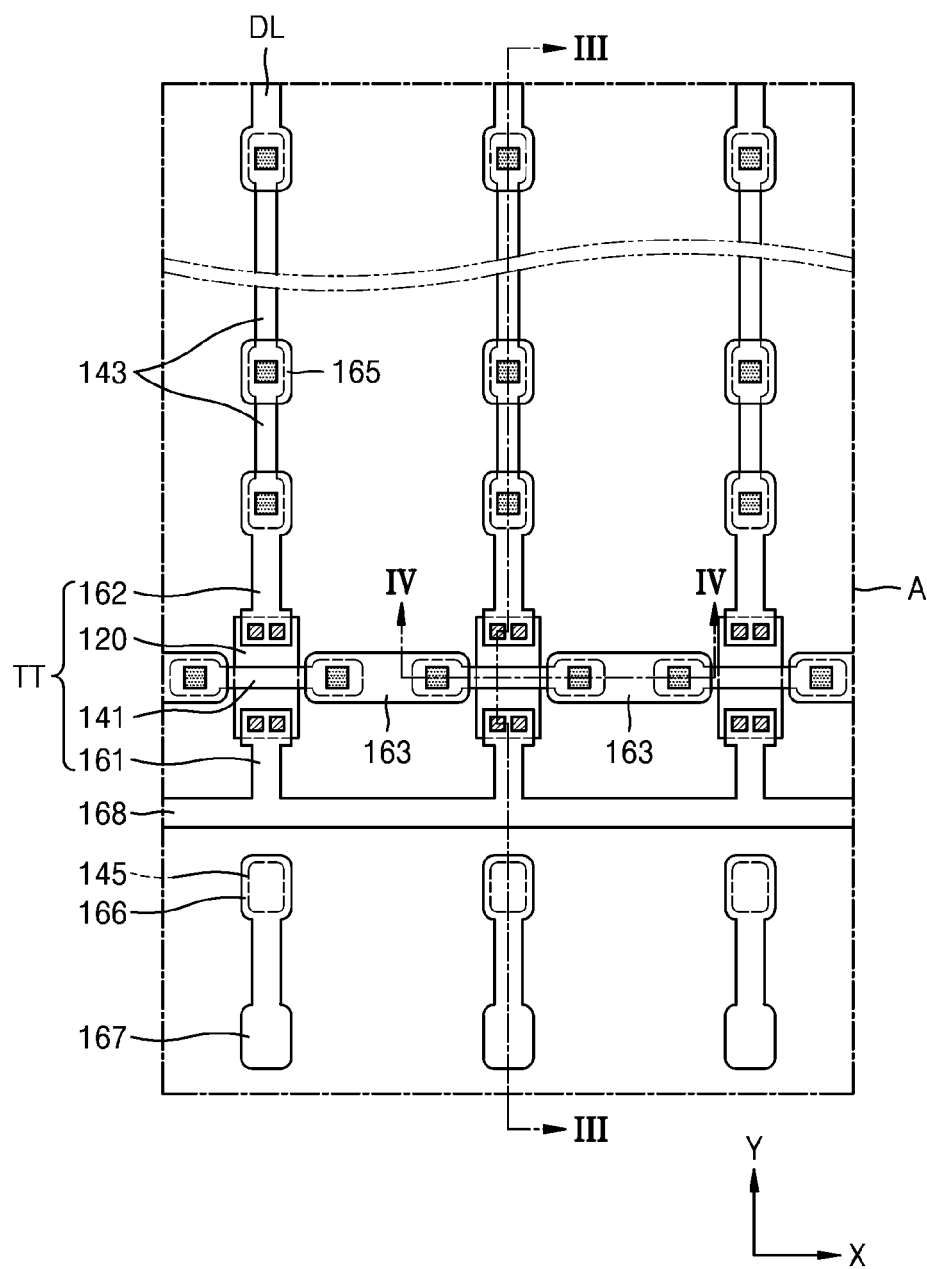
FIG. 2 is an enlarged top plan view of an exemplary embodiment of a portion A of FIG. 1.
Figure 3:
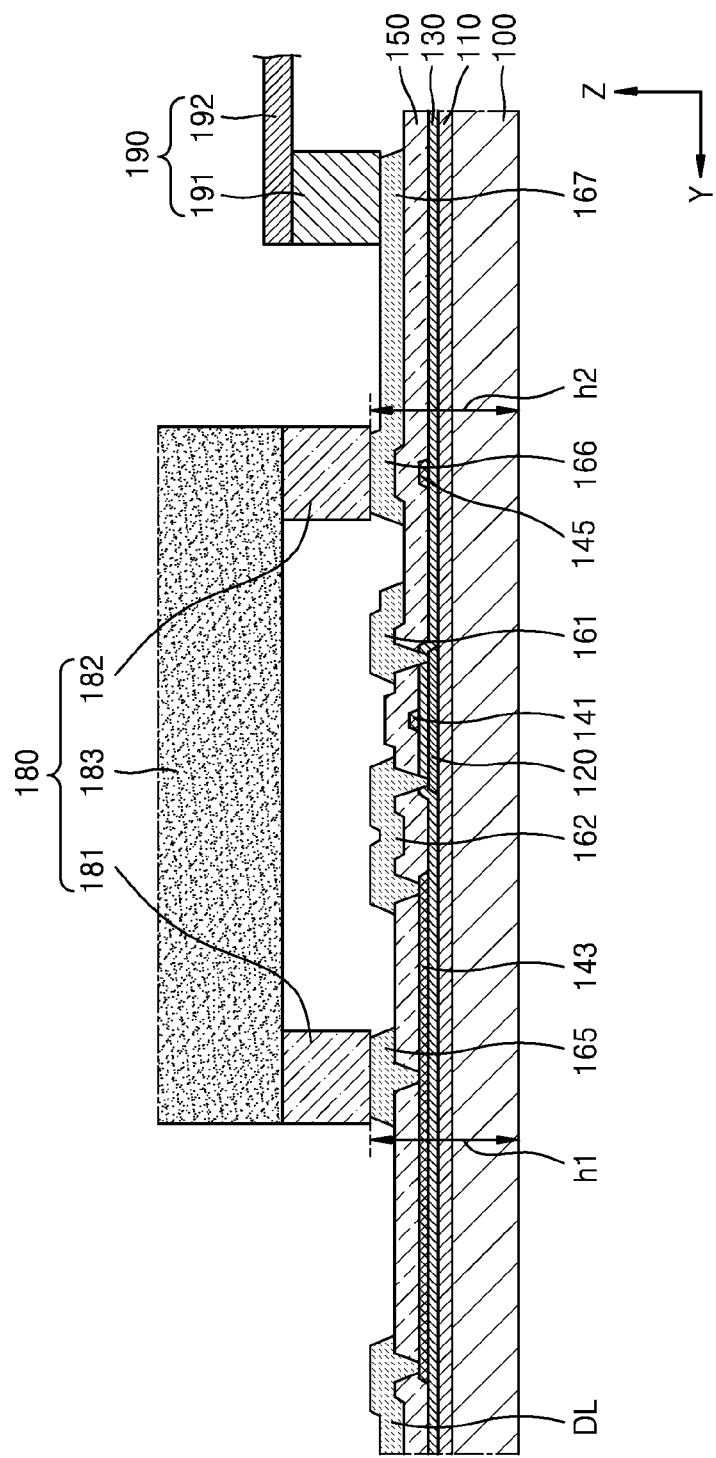
FIG. 3 is a cross-sectional view taken along line III-III of FIG. 2.
Figure 4:
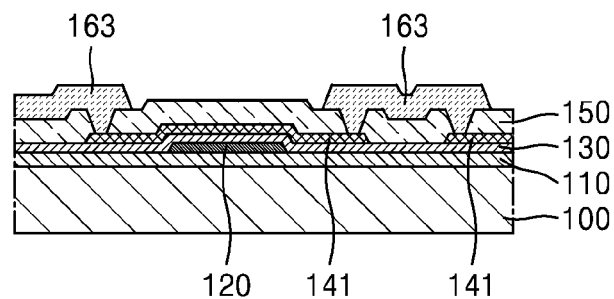
FIG. 4 is a cross-sectional view taken along line IV-IV of FIG. 2.

FIG. 1 is a top plan view of an exemplary embodiment of a portion of a display device in a manufacturing process according to the invention, FIG. 2 is an enlarged top plan view of an exemplary embodiment of a portion A of FIG. 1, FIG. 3 is a cross-sectional view taken along line III-III of FIG. 2, and FIG. 4 is a cross-sectional view taken along line IV-IV of FIG. 2.

As illustrated in FIG. 1, the display device according to the present embodiment includes a display area DA in which a plurality of pixels are arranged to generate and display an image, and a peripheral area PA outside the display area DA and at which the image is not displayed. According to this, a substrate 100 of the display device may be understood to include the display area DA and the peripheral area PA. The peripheral area PA includes a pad area PADA, which is an area at which various electronic devices or printed circuit boards, etc. are electrically attached to the substrate 100 and/or components thereof. The substrate 100 and layers thereon may be otherwise referred to as a display substrate of the display device, and more particularly, a display substrate of a display panel which generates and displays an images with light by control/driving signals provided thereto from other constituent elements of the display device.

FIG. 1 may be understood as a top plan view of components and elements of a display device such as a substrate, etc. during a manufacturing process of the display device. In a final display device or an electronic apparatus such as a smartphone including the display device, to minimize the planar area of the peripheral area PA recognized by a user, a portion of the substrate 100, etc. may be bent. In an exemplary embodiment, for example, the peripheral area PA may include a bending area, and the bending area may be arranged between the pad area PADA and the display area DA in the top plan view. In this case, the substrate 100 may be bent in the bending area such that at least a portion of the pad area PADA overlaps the display area DA. In this case, the bending direction is determined such that the pad area PADA does not hide or block the display area DA and is arranged behind the display area DA in a direction away from the user. Therefore, a user recognizes that the display area DA occupies most of the display device from a viewing side thereof.

The substrate 100 may include various materials having flexible or bendable characteristics, e.g., polymer resins such as polyethersulphone ("PES"), polyacrylate, polyetherimide ("PEI"), polyethylene napthalate ("PEN"), polyethylene-terephthalate ("PET"), polyphenylene sulfide ("PPS"), polyarylate ("PAR"), polyimide ("PI"), polycarbonate ("PC") or cellulose acetate propionate ("CAP"). The substrate 100 may be modified variously. In an exemplary embodiment, for example, the substrate 100 may have a multi-layered structure including two layers among the above polymer resins and a barrier layer including an inorganic material (such as a silicon oxide, a silicon nitride, a silicon oxynitride, etc.). Furthermore, in the case where the substrate 100 is not bent, the substrate 100 may include glass, etc.

The periphery of the display area DA may define a shape similar to a rectangle or a square on the whole. However, as illustrated in FIG. 1, the periphery of the display area DA may not have a sharp or linear edge portion. Specifically, the display area DA may include a first edge E1 and a second edge E2 facing each other, a third edge E3 and a fourth edge E4 facing each other and arranged between the first and second edges E1 and E2. The pad area PADA is adjacent to the fourth edge E4 among the first edge E1 to the fourth edge E4. In this case, a portion of the overall outer edge of the display area DA which connects the first edge E1 to the fourth edge E4 may have a rounded shape in the top plan view. A portion of the overall outer edge of the display area DA which connects the second edge E2 to the fourth edge E4 may have a rounded shape and other portions may have a rounded shape.

As illustrated in FIG. 2, the display device according to the present embodiment includes a thin film transistor TT provided in plurality arranged in the peripheral area PA, specifically, the pad area PADA. The plurality of thin film transistors TT may be connected to the pixels of the display area DA. The plurality of thin film transistors TT are switching elements for testing or inspecting the display device during a manufacturing process to determine whether pixels of the display area DA normally operate.

As illustrated in FIGS. 2 to 4, each of the thin film transistors TT includes a semiconductor layer 120 including amorphous silicon, polycrystalline silicon or an organic semiconductor material, a gate electrode 141, a source electrode 161 and a drain electrode 162. To secure insulation between the semiconductor layer 120 and the gate electrode 141, a gate insulating layer 130 including an inorganic material such as a silicon oxide, a silicon nitride and/or a silicon oxynitride may be arranged between the semiconductor layer 120 and the gate electrode 141. Also, an interlayer insulating layer 150 including an inorganic material such as a silicon oxide, a silicon nitride and/or a silicon oxynitride may be arranged on the gate electrode 141. The source electrode 161 and the drain electrode 162 may be arranged on the interlayer insulating layer 150. In an exemplary embodiment of a method of manufacturing a display device, the insulating layer including an inorganic material may be formed by chemical vapor deposition ("CVD") or atomic layer deposition ("ALD"). The same is true of embodiments and modified examples below.

A buffer layer 110 including an inorganic material such as a silicon oxide, a silicon nitride and/or a silicon oxynitride may be arranged between the thin film transistor TT and the substrate 100. The buffer layer 110 may increase flatness of the upper surface of the substrate 100 or minimize or effectively prevent penetration of impurities from the substrate 100, etc. to the semiconductor layer 120 of the thin film transistor TT such as from outside thereof.

The gate electrodes 141 of the thin film transistors TT may be electrically connected to each other by a bridge wiring 163 provided in plurality. That is, among individual layers disposed on the substrate 100, the bridge wirings 163 are arranged in a layer different from a layer in which the gate electrodes 141 are arranged to electrically connect the gate electrodes 141 spaced apart from each other to each other. FIG. 4 illustrates that the bridge wiring 163 electrically connects the gate electrodes 141 spaced apart from each other by directly contacting the gate electrodes 141 at contact holes of the interlayer insulating layer 150, which is an insulating layer between the bridge wiring 163 and the gate electrode 141. The same is true of embodiments and modified examples below. Therefore, as illustrated in FIG. 2, the gate electrodes 141 and the bridge wirings 163 may be arranged on a virtual straight line (extending in an x-axis direction). Each of the gate electrodes 141 and the bridge wirings 163 are a discrete (e.g., island) member.

Each of the thin film transistors TT includes the source electrode 161 and the drain electrode 162. The bridge wirings 163 may include the same material as that of the source electrode 161 and the drain electrode 162, for example, metal such as Ti or Al, and have a single-layered or multi-layered structure. Alternatively, among individual layers disposed on the substrate 100, the bridge wirings 163 may be arranged in a layer in which the source electrode 161 and the source electrode 162 are arranged. Therefore, the bridge wirings 163 may be connected to the gate electrodes 141 therebelow at contact holes in the interlayer insulating layer 150.

As illustrated in FIG. 1, a data line DL is provided in plurality each lengthwise extending along the y-axis direction across the display area DA to the peripheral area PA. The data lines DL respectively cross a virtual straight line (extending in an x-axis direction) along which the gate electrodes 141 and the bridge wirings 163 lengthwise extends and are arranged. A width of a data line DL and a gate electrode 141 is defined in a direction perpendicular to the length thereof, e.g., along the y-axis direction. The display device and/or components, layers, etc. thereof are disposed in a plane defined by first and second (e.g., x-axis and y-axis) directions crossing each other. A thickness of the display device and/or components, layers, etc. thereof, is defined in a third direction crossing each of the first and second direction, e.g., a z-axis direction, such as but not limited to being perpendicular thereto.

Each of the thin film transistors TT is electrically connected to a corresponding data line DL among the data lines DL. Therefore, when an electric signal is simultaneously applied to the gate electrodes 141 of the thin film transistors TT electrically connected to each other to turn the thin film transistors TT on, channels are simultaneously formed in the semiconductor layers 120 of the thin film transistors TT. When the thin film transistors TT are simultaneously turned on, an electric signal from a test signal line 168 is transferred to the data lines DL. Therefore, pixels of the display area DA electrically connected to the data lines DL emit light, and operation of the pixels inside the display area DA may be tested to determine whether the pixels are defective.

The gate electrodes 141 may include, for example, metal such as Mo or Al. In an exemplary embodiment of a manufacturing method of a display device, the gate electrodes 141 may be formed by a method such as sputtering. Also, after the gate electrodes 141 are formed, when forming the interlayer insulating layer 150 covering the gate electrodes 141, a method such as plasma enhanced chemical vapor deposition ("PECVD") or ALD may be used. In this case of forming the interlayer insulating layer 150 covering the gate electrodes 141, charges may be accumulated on the already-formed gate electrodes 141. Particularly, in the case of a process forming the insulating layer, etc. by PECVD after forming the gate electrodes 141, since plasma is applied, charges may be accumulated on the gate electrodes 141 during the process.

As described above, the gate electrodes 141 spaced apart from each other are electrically connected to each other by the bridge wirings 163.

A comparative configuration in which the gate electrodes 141 are not connected by the bridge wirings 163, and instead one single long gate line corresponding to the gate electrodes 141 extends (along an x-axis direction) over the semiconductor layers 120 of the thin film transistors TT may be considered. However, where the one single long gate line corresponding to the gate electrodes 141 extends (along an x-axis direction) over the semiconductor layers 120 of the thin film transistors TT, since the gate line is relatively long, a total amount of charges accumulated on the gate line rapidly increases during a manufacturing process. Also, due to the large amount of accumulated charges, a relatively strong electric field may be generated by a large potential difference between the one single gate line and the semiconductor layers 120 therebelow. Also, a phenomenon such as insulation destruction (dielectric destruction) is generated at the gate insulating layer 130 covering the semiconductor layer 120 by the relatively strong electric field. Therefore, even though the thin film transistors TT are completed by subsequent manufacturing processes, the thin film transistors TT may not properly operate. The improper operation of the thin film transistors TT becomes a cause by which the pixels inside the display area DA cannot be tested by using the thin film transistors TT.

One or more exemplary embodiment of a display device according to the invention may effectively prevent or minimize occurrence of a defect a display device caused from a defective pixel. As described above, since the gate electrodes 141 of the thin film transistors TT respectively have island shapes spaced apart from each other, the planar area of each gate electrode 141 is less than that of the above-described one single gate line. Accordingly, even though charges are respectively accumulated on the gate electrodes 141 during the manufacturing process, an amount of charges respectively accumulated on the gate electrodes 141 is minimal. Therefore, one or more exemplary embodiment of the display device according to the invention may reduce or effectively prevent the gate insulating layer 130, etc. from being damaged due to insulation destruction, etc., and thus effectively prevent or minimize occurrence of a defect of the thin film transistors TT, and further, a defect of the display device.

As described above, the plurality of data lines DL lengthwise extend to the peripheral area PA from across the display area DA. The data lines DL may include the same material as that of the source electrode 161 and the drain electrode 162 of the thin film transistors TT, for example, Ti or Al, and have a single-layered or multi-layered structure. Alternatively, the plurality of data lines DL may have a three-story structure of Ti/Al/Ti. Furthermore, the data lines DL may be arranged in a layer in which the source electrode 161 and the drain electrode 162 are arranged. Each of the thin film transistors TT is electrically connected to a corresponding data line DL among the data lines DL by a connection wiring 143 provided in plurality. That is, the connection wirings 143 connect the data lines DL to the thin film transistors TT.

The connection wirings 143 may include the same material as that of the gate electrode 141, for example, metal such as Mo or Al, and have a single-layered or multi-layered structure. Furthermore, the connection wirings 143 may be arranged in a same layer in which the gate electrodes 141 are arranged, among layers disposed on the substrate 100. As used herein, elements being in a same layer as each other may also indicate the elements are formed from a same material layer in a method of manufacturing the display device.

A first end of the connection wiring 143 is connected to the data line DL thereon, at a contact hole formed in the interlayer insulating layer 150, and a second end of the connection wiring 143 opposite to the first end thereof is connected to the drain electrode 162 of the thin film transistor TT thereon, at a contact hole formed in the interlayer insulating layer 150. The source electrodes 161 of the thin film transistors TT are connected to the test signal line 168 which lengthwise extends in the x-axis direction. Specifically, the source electrodes 161 may be formed as one body with the test signal line 168.

As illustrated in FIGS. 2 and 3, the display device may further include an output pad 165 provided in plurality. Each of the output pads 165 may be arranged on a corresponding connection wiring 143 among the connection wirings 143 and may contact the corresponding connection wiring 143. Each of the output pads 165 may include the same material as that of the source electrode 161 and the drain electrode 162 of the thin film transistor TT, for example, metal such as Ti or Al and may have a single-layered or multi-layered structure. Alternatively, the output pads 165 may have a three-story structure of Ti/Al/Ti. Furthermore, the output pads 165 may be arranged in a same layer in which the source electrode 161 and the drain electrode 162 are arranged among layers disposed on the substrate 100. Therefore, the output pads 165 may be connected to the connection wiring 143 thereunder at a contact hole formed in the interlayer insulating layer 150.

An input pad 166 provided in plurality may be arranged at a side of the thin film transistors TT, which is opposite to the side (+y-axis direction) of the thin film transistors TT at which the output pads 165 are arranged. Each of the input pads 166 may include the same material as that of the source electrode 161 and the drain electrode 162 of the thin film transistor TT, for example, metal such as Ti or Al and have a single-layered or multi-layered structure. Alternatively, the input pads 166 may have a three-story structure of Ti/Al/Ti. Furthermore, the input pads 166 may be arranged in a same layer in which the source electrode 161 and the drain electrode 162 are arranged among layers disposed on the substrate 100.

The input pads 166 and the output pads 165 may be connected to a driving chip 180 of the display device. The driving chip 180 includes a body 183 and an output terminal 181 provided in plurality and an input terminal 182 provided in plurality each of which are arranged on opposite sides of the body 183. Since FIG. 3 is a cross-sectional view along line III-III, only one output terminal 181 and one input terminal 182 of the driving chip 180 are illustrated, but the driving chip 180 may include a plurality of output terminals 181 and a plurality of input terminal 182 (arranged in the x-axis direction). The driving chip 180 may be, for example, an integrated circuit ("IC") chip, etc.

The input pads 166 on the substrate 100 are respectively connected to the input terminals 182 of the driving chip 180, and the output pads 165 on the substrate 100 are respectively connected to the output terminals 181 of the driving chip 180. Therefore, when the display device is not tested and is actually driven, an electric signal transmitted into the input terminal 182 of the driving chip 180 from outside thereof is transferred from the output terminals 181 of the driving chip 180 to the data lines DL by way of the output pads 165 and the connection wirings 143 on the substrate 100, and consequently, may be transferred to the thin film transistors 210 (see FIG. 5) of the pixels inside the display area DA.

Information and signals for generating an image to be displayed in the display area DA may be input to the driving chip 180 through the input terminals 182 of the driving chip 180. For this purpose, the display device may include a printed circuit board 190 including a plate 192 and an output terminal 191. The input pads 166 on the substrate 100 extend in a direction away from the thin film transistors TT toward an edge of the substrate 100, and an end portion 167 of the input pads 166 furthest away from the thin film transistors TT may be electrically connected to the output terminal 191 of the printed circuit board 190. The printed circuit board 190 is a constituent element of the display device from which and through which an electric signal such as data signal, control signal, and/or driving signal for generating and displaying an image passes to the display substrate of the display device. The electrical signal for displaying the image passes from the printed circuit board 190 through the input pad 166, the driving chip 180, the output pad 165 and the connection wiring 143, without passing through the thin film transistor TT used for testing.

As the input terminals 182 of the driving chip 180 are connected to the input pads 166 on the substrate 100, and the output terminals 181 of the driving chip 180 are connected to the output pads 165 on the substrate 100, the driving chip 180 is arranged over the thin film transistors TT which are used as a switching element for testing, as illustrated in FIG. 3. In this case, to stably arrange the driving chip 180, a height h1 in the z-axis direction from the lower surface of the substrate 100 to the upper surface of the output pads 165 is substantially equal to a height h2 in the z-axis direction from the lower surface of the substrate 100 to the upper surface of the input pads 166.

For this purpose, since the connection wirings 143 are arranged below the output pads 165 on the substrate 100, a step difference adjustor 145 may be arranged below a portion of each of the input pads 166 at ends thereof closer to the plurality of thin film transistors TT. The step difference adjustor 145 may include the same material as that of the connection wirings 143, that is, the same material as that of the gate electrodes 141, for example, metal such as Mo or Al, and have a single-layered or multi-layered structure. Furthermore, the step difference adjustor 145 may be arranged in a same layer in which the connection wirings 143 and the gate electrodes 141 are arranged among layers disposed on the substrate 100. Unlike the configuration illustrated in FIGS. 2 and 3, a step difference adjustor 145 may be arranged below the end portion 167 of each of the input pads 166 at ends thereof furthest away from the thin film transistors TT, that is, below the end portion 167 connected to the output terminal 191 of the printed circuit board 190 at the edge portion of the substrate 100.

Although FIG. 3 illustrates that the input terminals 182 of the driving chip 180 directly contact the input pads 166, the present disclosure is not limited thereto. In an exemplary embodiment, for example, an anisotropic conductive film, etc. may be arranged between the input terminals 182 of the driving chip 180 and the input pads 166. This same configuration is also applicable between the output terminals 181 of the driving chip 180 and the output pads 165 on the substrate 100 and also applicable between the output terminals 191 of the printed circuit board 190 and the end portion 167 of the input pads 166 on the substrate 100 at an end thereof furthest away from the thin film transistors TT. This configuration is equally applicable to embodiments and modified examples described below.

Figure 5:
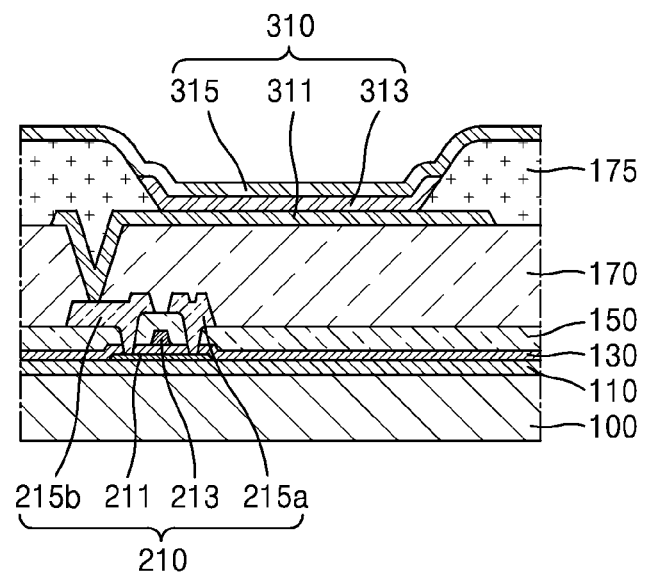
FIG. 5 is an enlarged cross-sectional view of an exemplary embodiment of a portion inside a display area of the display device of FIG. 1.

FIG. 5 is an enlarged cross-sectional view of an exemplary embodiment of a portion inside a display area DA of the display device of FIG. 1, such as in a pixel thereof. As illustrated in FIG. 5, a display element 310 and a (display) thin film transistor 210 which is electrically connected to the display element 310 may be arranged in the display area DA of the substrate 100. FIG. 5 illustrates that an organic light-emitting diode ("OLED") as a display element is arranged in the display area DA. A configuration in which the OLED is electrically connected to the thin film transistor 210 may mean that a pixel electrode 311 is electrically connected to the thin film transistor 210.

A semiconductor layer 211, a gate electrode 213, a source electrode 215a, and a drain electrode 215b of the thin film transistor 210 inside the display area DA may respectively include the same materials as those of the semiconductor layer 120, the gate electrode 141, the source electrode 161, and the drain electrode 162 of the thin film transistor TT in the peripheral area PA described above, and may be respectively arranged in the same layers in which the semiconductor layer 120, the gate electrode 141, the source electrode 161, and the drain electrode 162 are respectively arranged among layers disposed on the substrate 100.

A planarization layer 170 may be arranged on the thin film transistor 210. In an exemplary embodiment, for example, as illustrated in FIG. 5, in the case where the OLED is arranged over the thin film transistor 210, the planarization layer 170 may generally planarize the upper portion of the thin film transistor 210. The planarization layer 170 may include an organic material such as acryl, benzocyclobutene ("BCB") or hexamethyldisiloxane ("HMDSO"). Though FIG. 5 illustrates that the planarization layer 170 is a single layer, the planarization layer 170 may be a multi-layer structure.

The display element 310 may be arranged on the planarization layer 170 in the display area DA of the substrate 100. The display element 310 may be, for example, an OLED including the pixel electrode 311, an opposite electrode 315, and an intermediate layer 313 arranged between the pixel electrode 311 and the opposite electrode 315 and including an emission layer. The pixel electrode 311 is electrically connected to the thin film transistor 210 by contacting one of the source electrode 215a and the drain electrode 215b at an opening formed in the planarization layer 170, etc. as illustrated in FIG. 5. The display element 310 may generate the light used to display an image. The pixel at which the display element 310 is disposed may generally be an area at which light is generated and/or emitted to display the image.

A pixel-defining layer 175 may be arranged on the planarization layer 170. The pixel-defining layer 175 defines a pixel by an opening corresponding to each sub-pixel, that is, an opening exposing at least a portion such as a central portion of the pixel electrode 311. Also, in the case illustrated in FIG. 5, the pixel-defining layer 175 prevents an electrical arc, etc. from occurring at an edge of the pixel electrode 311 by increasing a distance between an edge of the pixel electrode 311 and the opposite electrode 315 which is disposed over the pixel electrode 311. The pixel-defining layer 175 may include an organic material such as polyimide or HMDSO.

The intermediate layer 313 of the OLED may include a relatively low molecular or polymer material. In the case where the intermediate layer 313 includes a relatively low molecular material, the intermediate layer 313 may have a structure in which a hole injection layer ("HIL"), a hole transport layer ("HTL"), an emission layer ("EML"), an electron transport layer ("ETL"), an electron injection layer ("EIL"), etc. are stacked in a single or a composite configuration. In an exemplary embodiment of a method of manufacturing a display device, the intermediate layer 313 may be formed by vacuum evaporation. In the case where the intermediate layer 313 includes a polymer material, the intermediate layer 313 may generally have a structure including an HTL and an EML. In this case, the HTL may include a poly(3,4-ethylenedioxythiophene ("PEDOT") material, and the EML may include a polymer material such as polyphenylene vinylene ("PPV")-based material and a polyfluorene-based material. In an exemplary embodiment of a method of manufacturing a display device, the intermediate layer 313 may be formed by screen printing, inkjet printing or laser induced thermal imaging ("LITI"), etc. The intermediate layer 313 is not limited thereto and may have various structures. Also, the intermediate layer 313 may include a layer formed as one body commonly over a plurality of pixel electrodes 311 or may include a layer patterned into discrete shapes to respectively correspond to the plurality of pixel electrodes 311.

The opposite electrode 315 may be arranged in the display area DA and may cover the display area DA. That is, the opposite electrode 315 may be formed as one body commonly over a plurality of OLEDs and correspond to all of the plurality of pixel electrodes 311.

Since the OLED may be easily damaged by external moisture or oxygen, the OLED may be protected by being covered by an encapsulation layer (not shown). The encapsulation layer may cover the display area DA and extend to at least a portion of the peripheral area PA. The encapsulation layer may include a first inorganic encapsulation layer, an organic encapsulation layer, and a second inorganic encapsulation layer.

Figure 6:
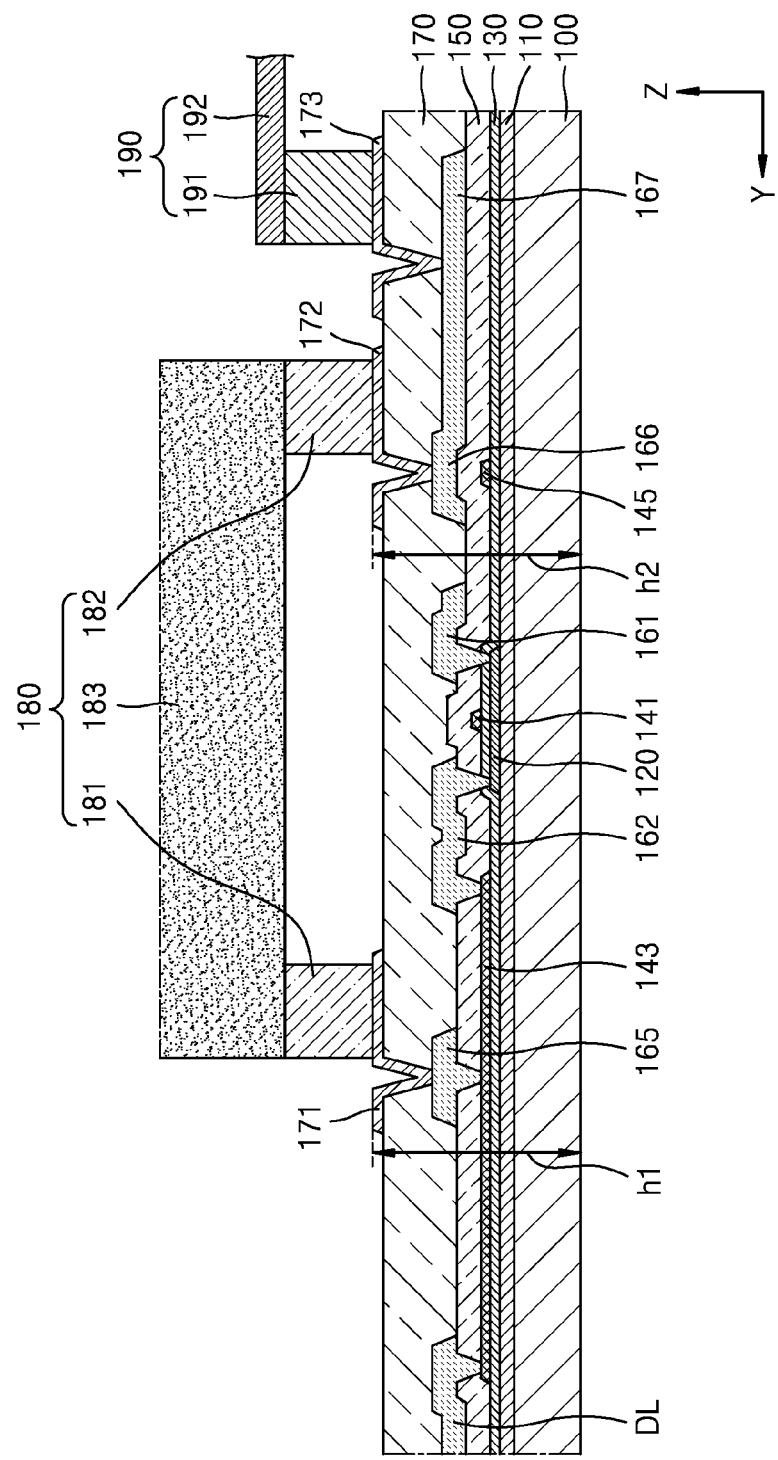
FIG. 6 is an enlarged cross-sectional view of a modified exemplary embodiment of a portion A of a display device taken along line III-III of FIG. 2 according to the invention.
Figure 7:
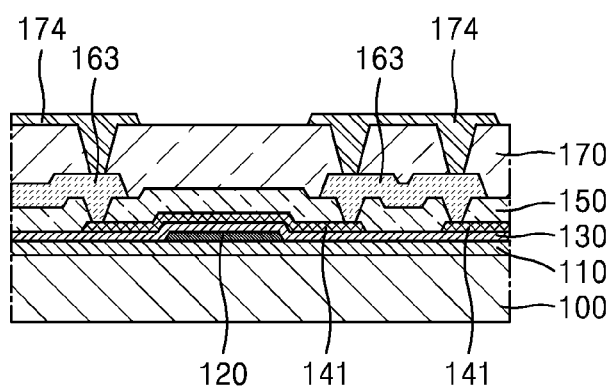
FIG. 7 is a cross-sectional view of the portion A of the display device of FIG. 6 taken along line IV-IV of FIG. 2.

Similar to the buffer layer 110, the gate insulating layer 130 and the interlayer insulating layer 150, the planarization layer 170 is arranged in the display area DA and may extend from the display area DA to be arranged in even the peripheral area PA. FIG. 6 is an enlarged cross-sectional view of a modified exemplary embodiment of a portion A of a display device taken along line III-III of FIG. 2 according to the invention. FIG. 7 is a cross-sectional view of the portion A of the display device of FIG. 6 taken along line IV-IV of FIG. 2.

As illustrated in FIG. 6, the planarization layer 170 disposed in the display area DA may extend to the peripheral area PA, and particularly into the pad area PADA and may cover the input pads 166 and the output pads 165 on the substrate 100. Accordingly, an additional input pad 172 and an additional output pad 171 may each be provided in plurality and arranged on the planarization layer 170 to respectively correspond to the input pads 166 and the output pads 165. The additional input pads 172 and the additional output pads 171 are connected to the input pads 166 and the output pads 165 therebelow at contact holes formed in the planarization layer 170. Also, the additional input pads 172 are connected to the input terminals 182 of the driving chip 180, and the additional output pads 171 are connected to the output terminals 181 of the driving chip 180. The additional input pads 172 and the additional output pads 171 may include the same material as that of the pixel electrode 311 of the display element 310 inside the display area DA, for example, indium tin oxide ("ITO"), indium zinc oxide ("IZO") and/or $In_2O_3$. As including the same material as the pixel electrode 311, the additional input pads 172 and the additional output pads 171 may be in a same layer as the pixel electrode 311 among layers disposed on the substrate 100.

Since the planarization layer 170 covers the input pads 166, the planarization layer 170 covers the end portions 167 of the input pads 166 disposed furthest from the thin film transistor TT among opposing ends of the input pads 166. Therefore, an additional signal pad 173 may be provided in plural and arranged on the planarization layer 170 to correspond to the end portions 167 of the input pads 166 in the direction away from the thin film transistor TT. The additional signal pads 173 are connected to the end portions 167 of the input pads 166 therebelow at contact holes formed in the planarization layer 170. Also, the additional signal pads 173 are connected to the output terminals 191 of the printed circuit board 190. The additional signal pads 173 may include the same material as that of the pixel electrode 311 of the display element 310 inside the display area DA, for example, ITO, IZO and/or $In_2O_3$. As including the same material as the pixel electrode 311, the additional signal pads 173 may be in a same layer as the pixel electrode 311 among layers disposed on the substrate 100.

As illustrated in FIG. 7, additional bridge wirings 174 may be arranged on the planarization layer 170 corresponding to the bridge wirings 163 such that the additional bridge wirings 174 correspond to the bridge wirings 163. The additional bridge wirings 174 may be connected to the bridge wirings 163 at contact holes formed in the planarization layer 170. The additional bridge wirings 174 may include the same material as that of the pixel electrode 311 of the display element 310 inside the display area DA, for example, ITO, IZO and/or $In_2O_3$. As including the same material as the pixel electrode 311, the additional bridge wirings 174 may be in a same layer as the pixel electrode 311 among layers disposed on the substrate 100. Since the bridge wiring 163 is parallel-connected to the additional bridge wiring 174, an overall electrical resistance may be reduced when a structure including the bridge wiring 163 and the additional bridge wiring 174 are considered.

Figure 8:
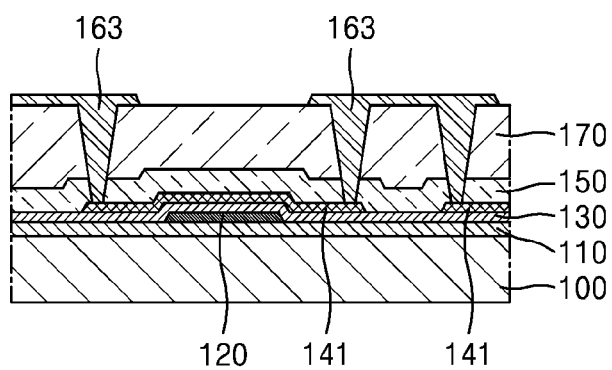
FIG. 8 is an enlarged cross-sectional view of another exemplary embodiment of the portion A of the display device of FIG. 6 taken along line IV-IV of FIG. 2 according to the invention.

The present disclosure is not limited thereto. As illustrated in FIG. 8, which is an enlarged cross-sectional view of another exemplary embodiment of the portion A of the display device of FIG. 6 taken along line IV-IV of FIG. 2 according to the invention, the bridge wirings 163 are not arranged between the interlayer insulating layer 150 and the planarization layer 170, but may be arranged extended through the planarization layer 170 to be disposed on an upper surface thereof. In this case, the bridge wirings 163 may include the same material as that of the pixel electrode 311 of the display element 310 inside the display area DA, for example, ITO, IZO and/or $In_2O_3$. An individual one of the bridge wirings 163 is commonly disposed for two adjacent gate electrodes 141 at an individual one of the additional bridge wirings 174.

Figure 9:
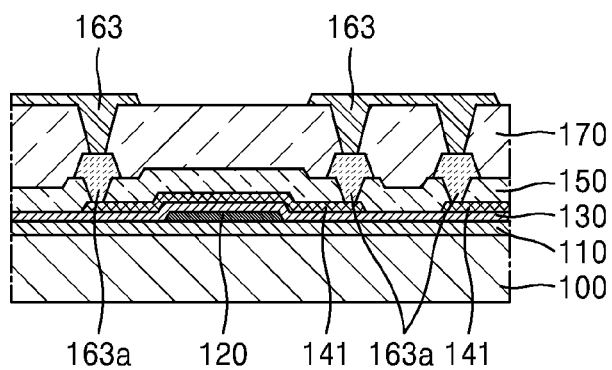
FIG. 9 is an enlarged cross-sectional view of still another exemplary embodiment of the portion A of the display device of FIG. 6 taken along line IV-IV of FIG. 2 according to the invention.

As illustrated in FIG. 9, which is an enlarged cross-sectional view of still another exemplary embodiment of the portion A of the display device of FIG. 6 taken along line IV-IV of FIG. 2, the bridge wirings 163 are not arranged between the interlayer insulating layer 150 and the planarization layer 170, but may be arranged on an upper surface of the planarization layer 170, and connection wirings 163a may be arranged between the gate electrodes 141 and the bridge wirings 163.

In this case, the bridge wirings 163 may include the same material as that of the pixel electrode 311 of the display element 310 inside the display area DA, for example, ITO, IZO and/or $In_2O_3$. As including the same material as the pixel electrode 311, the a bridge wirings 163 may be in a same layer as the pixel electrode 311 among layers disposed on the substrate 100. The connection wirings 163a may include the same material as that of the source electrode 161 and the drain electrode 162 of the thin film transistor TT, for example, metal such as Ti or Al, and have a single-layered or multi-layered structure. Alternatively, the connection wirings 163a may have a three-story structure of Ti/Al/Ti. As including the same material as the source electrode 161 and the drain electrode 162, the connection wirings 163a may be in a same layer as the source electrode 161 and the drain electrode 162 among layers disposed on the substrate 100. In contrast to FIG. 8, more than one individual connection wirings 163a are disposed for two adjacent gate electrodes 141 at an individual one of the bridge wirings 163.

Figure 10:
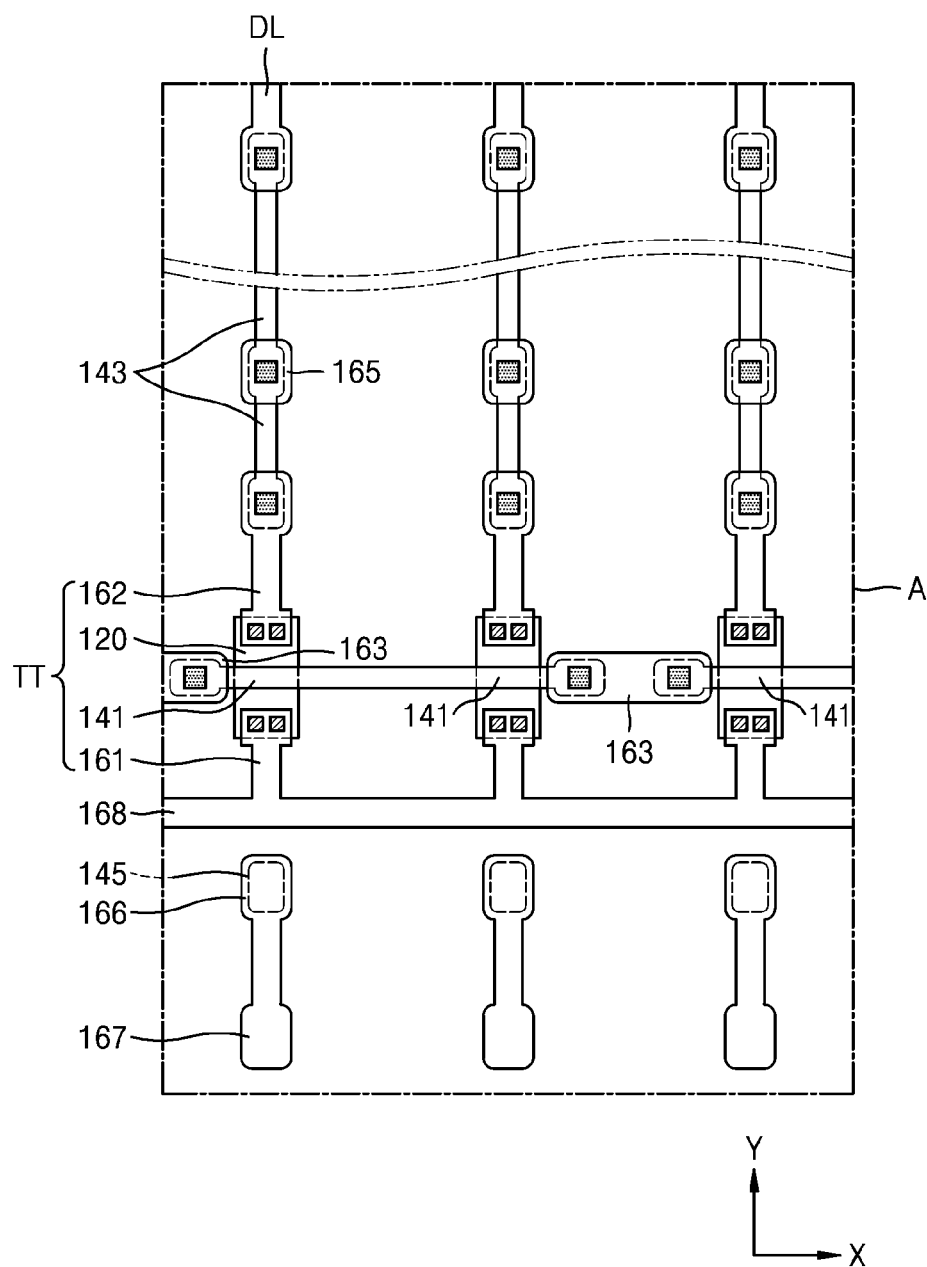
FIG. 10 is a top plan view of another exemplary embodiment of a portion of a display device in a manufacturing process according to the invention.

FIG. 10 is a top plan view of another exemplary embodiment of a portion of a display device in a manufacturing process according to the invention. As illustrated in FIG. 10, not all of the gate electrodes 141 are spaced apart from each other over the thin film transistors TT, and a group of gate electrodes 141 may form one body over a group of adjacent thin film transistors TT. FIG. 10 illustrates that each of the discrete shape gate electrodes 141 form one body over two adjacent thin film transistors TT. The gate electrodes 141, which form one body over two adjacent thin film transistors TT, are spaced apart from other gate electrodes 141 of other thin film transistors TT, but are electrically connected to the other gate electrodes 141 of the other thin film transistors TT by the bridge wirings 163.

As described above, the gate electrodes 141 each over more than one thin film transistor TT are electrically connected to each other as described in the display device according to the above embodiment.

A comparative configuration in which the gate electrodes 141 are not connected by the bridge wirings 163, and instead one single long gate line corresponding to the gate electrodes 141 extends over the semiconductor layers 120 of the thin film transistors TT may be considered. However, where the one single long gate line corresponding to the gate electrodes 141 extends (along an x-axis direction) over the semiconductor layers 120 of the thin film transistors TT, a phenomenon such as insulation destruction (dielectric destruction) may occur in the gate insulating layer 130 covering the semiconductor layers 120.

In one or more exemplary embodiment of the display device according to the invention, the gate electrodes 141 of the thin film transistors TT are spaced apart from each other by having an island shape. However, though the gate electrodes 141 each form one body corresponding to more than one of adjacent thin film transistors TT, the gate electrodes 141, which form one body over more than one thin film transistor TT, are spaced apart from other gate electrodes 141 forming one body over other thin film transistors TT. Accordingly, the planar area of the gate electrodes 141, which each form one body over more than one thin film transistor TT, is less than that of the above-described one single gate line. Therefore, even though charges are accumulated on the collection of gate electrodes 141, which each form one body over more than one thin film transistor TT, an amount of charges accumulated on the gate electrodes 141, is minimal. Therefore, one or more exemplary embodiment of the display device according to the invention may reduce or effectively prevent the gate insulating layer 130, etc. from being damaged by insulation destruction, etc. during a manufacturing process, and consequently, may effectively prevent or minimize occurrence of defect of thin film transistors TT and further, defect of the display device.

Figure 11:
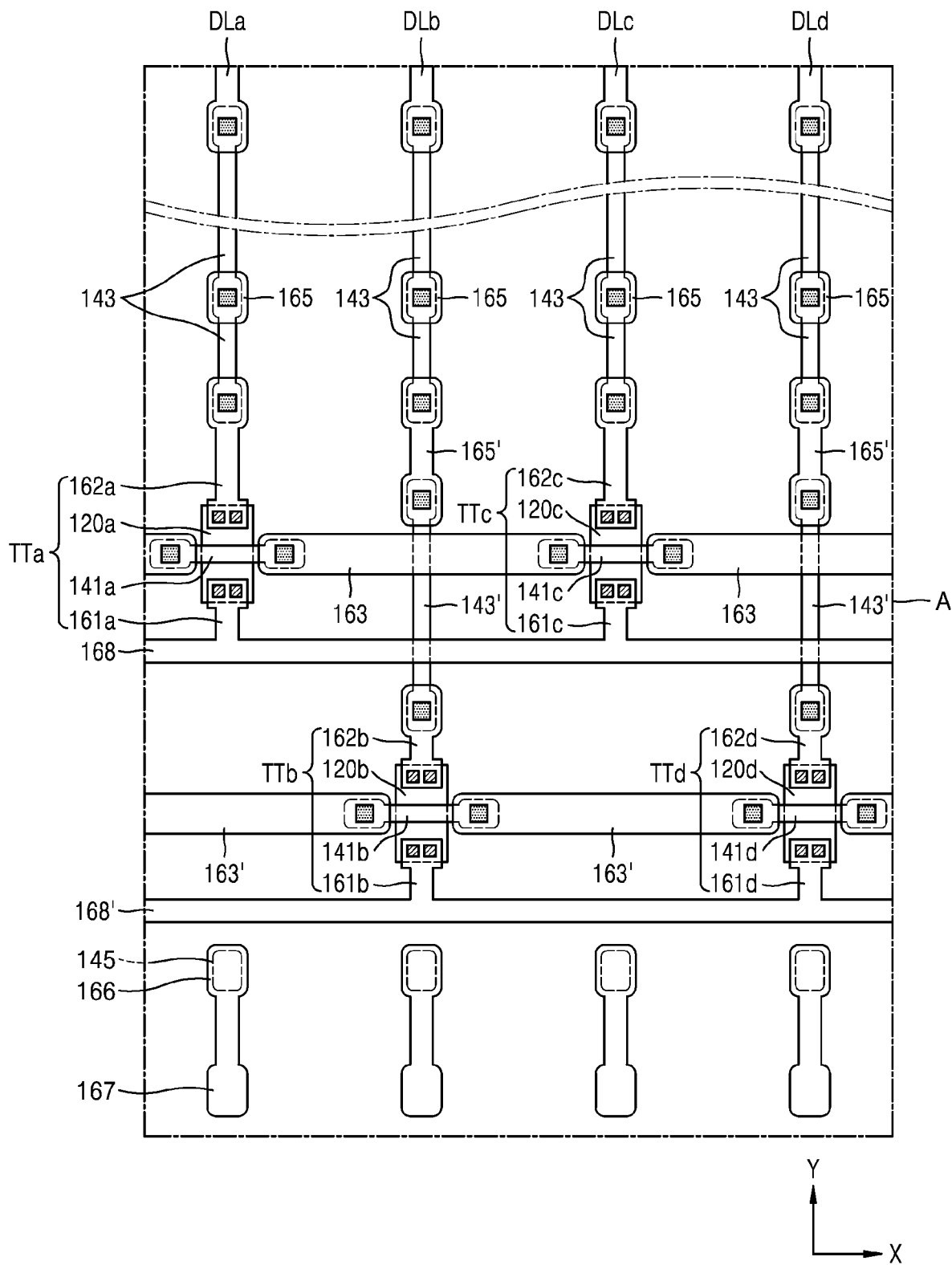
FIG. 11 is a top plan view of still another exemplary embodiment of a portion of a display device in a manufacturing process according to the invention.

FIG. 11 is a top plan view of still another exemplary embodiment of a portion of a display device in a manufacturing process according to the invention. FIG. 11 illustrates four data lines DLa, DLb, DLc, and DLd sequentially arranged (in the x-axis direction), for convenience of description.

The data lines DLa and DLc are electrically connected to corresponding thin film transistors TTa and TTc by the connection wirings 143. Gate electrodes 141a and 141c of the thin film transistors TTa and TTc are spaced apart from each other and are electrically connected by the bridge wiring 163. The thin film transistors TTa and TTc and the gate electrodes 141a and 141c thereof, forming a first group of thin film transistors TT are aligned on a first virtual line in the x-axis direction. The bridge wiring 163 of the first group of thin film transistors TT passes over a wiring electrically connected to the data line DLb between the data lines DLa and DLc.

Thin film transistors TTb and TTd and gate electrodes 141b and 141d thereof, forming a second group of thin film transistors TT are aligned on a second virtual line in the x-axis direction different from the first virtual line, to be disposed in a staggered arrangement from the first group of thin film transistors TT. The data line DLb between the data lines DLa and DLc, and the data line DLd arranged at a side of the data line DLc, which is opposite to the data line DLb, are electrically connected to the connection wirings 143. The connection wirings 143 connected to the data lines DLb and DLd are electrically connected to additional connection wirings 143' by auxiliary bridge wirings 165' including the same material as that of a source electrode 161b and a drain electrode 162b and arranged in a layer in which the source electrode 161b and the drain electrode 162b are arranged. Gate electrodes 141b and 141d of the thin film transistors TTb and TTd are spaced apart from each other and are electrically connected by the bridge wiring 163'.

The additional connection wirings 143' extend to pass below the test signal line 168 through which a test signal may be applied to source electrodes 161a and 161c of the thin film transistors TTa and TTc and are electrically connected to drain electrodes 162b and 162d of thin film transistors TTb and TTd. Also, the source electrodes 161b and 161d of the thin film transistors TTb and TTd form one body with a test signal line 168'.

The display device according to the present embodiment may allow channels to be simultaneously formed in semiconductor layers 120a and 120c of the thin film transistors TTa and TTc by simultaneously applying an electric signal to the gate electrodes 141a and 141c of the thin film transistors TTa and TTc, and thus allow the thin film transistors TTa and TTc to be simultaneously turned on. Therefore, whether the pixels inside the display area DA are defective may be tested by transferring an electric signal from the test signal line 168 to the data lines DLa and DLc through the source electrodes 161a and 161c, the semiconductor layers 120a and 120c, and the drain electrodes 162a and 162c of the thin film transistors TTa and TTc, and allowing the pixels inside the display area DA electrically connected to the data lines DLa and DLc to emit light.

Likewise, the display device may allow channels to be simultaneously formed in semiconductor layers 120b and 120d of the thin film transistors TTb and TTd by simultaneously applying an electric signal to the gate electrodes 141b and 141d of the thin film transistors TTb and TTd, and thus allow the thin film transistors TTb and TTd to be simultaneously turned on. Therefore, whether the pixels inside the display area DA are defective may be tested by transferring an electric signal from the test signal line 168' to the data lines DLb and DLd through the source electrodes 161b and 161d, the semiconductor layers 120b and 120d, and the drain electrodes 162b and 162d of the thin film transistors TTb and TTd, and allowing the pixels inside the display area DA electrically connected to the data lines DLb and DLd to emit light.

In an exemplary embodiment, for example, if the pixels connected to the data lines DLa and DLc are pixels emitting red light and the pixels connected to the data lines DLb and DLd are pixels emitting green light, it is possible to test whether only the pixels emitting red light are defective or to test whether only the pixels emitting green light are defective. Though not illustrated in FIG. 11 for convenience of description, it may be also implemented to test whether only the pixels emitting blue light are defective by using the same/similar structure.

Figure 12:
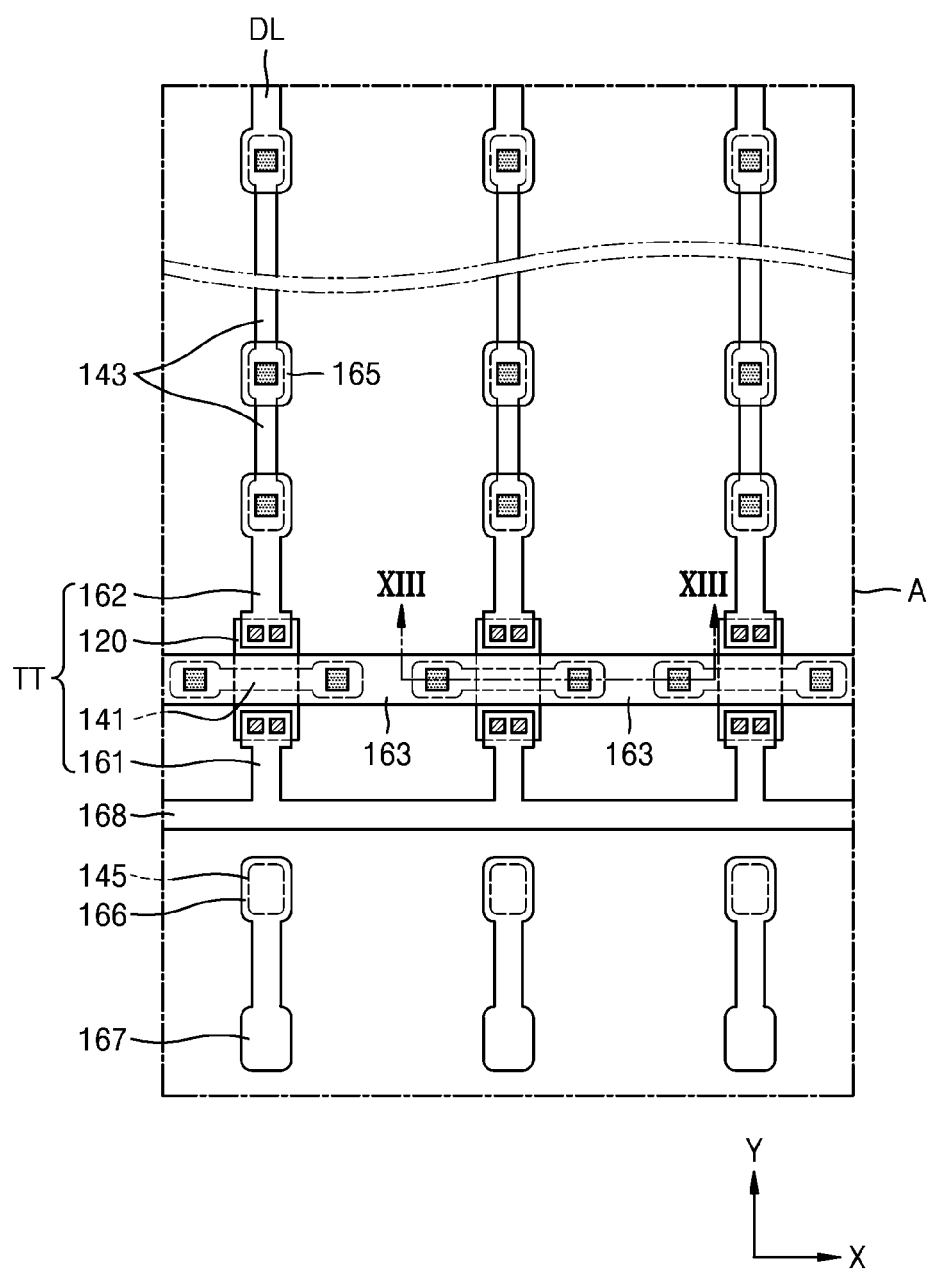
FIG. 12 is a top plan view of yet another exemplary embodiment of a portion of a display device in a manufacturing process according to the invention.
Figure 13:
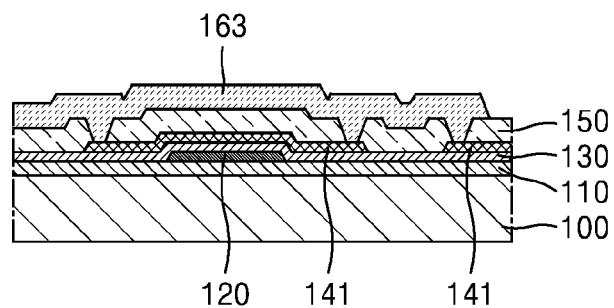
FIG. 13 is a cross-sectional view taken along line XIII-XIII of FIG. 12.

Though the bridge wirings 163 have been described to electrically connect the gate electrodes 141 spaced apart from each other in the above, the embodiment is not limited thereto. As illustrated in FIG. 12 is a top plan view of yet another exemplary embodiment of a portion of a display device in a manufacturing process according to the invention, and FIG. 13 is a cross-sectional view taken along line XIII-XIII of FIG. 12, the bridge wiring 163 may be a conductive layer, which is formed as one body, corresponding to more than one of the gate electrodes 141. In this case, the bridge wiring 163, which is a one-body type conductive layer, may have a shape lengthwise extending in one direction, for example, along the direction in which the gate electrodes 141 are arranged. The bridge wiring 163, which is a one-body type conductive layer, may electrically connect three or more gate electrodes 141 by contacting the three or more gate electrodes 141 at a plurality of contact holes formed in the interlayer insulating layer 150 arranged between the bridge wiring 163, which is a one-body type conductive layer, and the gate electrodes 141.

Though FIG. 12 illustrates a modified example of a display device according to the embodiment described with reference to FIG. 2, the embodiment is not limited thereto. In an exemplary embodiment, for example, even in the display devices according to the embodiments described with reference to FIGS. 7 to 11, the bridge wiring 163 may be a one-body type conductive layer corresponding to three or more of the gate electrodes 141, and the bridge wiring 163, which is a one-body type conductive layer, may have a shape lengthwise extending in one direction, for example, along the direction in which the gate electrodes 141 are arranged, and electrically connect three or more gate electrodes 141.

In the modified example of the display device illustrated in FIG. 11, the bridge wiring 163, which is a one-body type conductive layer, may electrically connect the gate electrodes 141a and 141c of the thin film transistors TTa and TTc to other gate electrodes arranged (in the x-axis direction) on the same line as that of the gate electrodes 141a and 141c. Similarly, the bridge wiring 163', which is a one-body type conductive layer, may electrically connect the gate electrodes 141b and 141d of the thin film transistors TTb and TTd to other gate electrodes arranged (in the x-axis direction) on the same line as that of the gate electrodes 141b and 141d. In this case, the bridge wiring 163, which is a one-body type conductive layer, and the bridge wiring 163', which is a one-body type conductive layer, may extend in directions approximately parallel to each other.

Though various embodiments of the present disclosure have been described, the embodiment is not limited thereto. In an exemplary embodiment, for example, in a display device in which a (display) substrate thereof includes a display area and a peripheral area which is outside the display area, a plurality of electrode pairs including a source electrode and a drain electrode spaced apart from each other are arranged in the peripheral area. If a gate line extending in one single direction includes first conductive layers and second conductive layers alternately arranged in the extension direction, this configuration may belong to the scope of the present disclosure.

In an exemplary embodiment, for example, in FIG. 2, in a display device in which the plurality of electrode pairs including the source electrode 161 and the drain electrode 162 spaced apart from each other are arranged in the peripheral area PA and the gate line extending in one direction passes between the source electrode 161 and the drain electrode 162 of each of the electrode pairs, the gate line may be understood to include the first conductive layers 141 and the second conductive layers 163 alternately arranged in the extension direction. In this case, the first conductive layers 141 may be arranged in a layer different from that in which the second conductive layers 163 are arranged, among layers on the substrate 100. In an exemplary embodiment, for example, as described above, the first conductive layers 141 may be arranged on the gate insulating layer 130, and the second conductive layers 163 may be arranged on the interlayer insulating layer 150. The first conductive layers 141 are electrically connected to the second conductive layers 163.

Here, since the electrode pairs including the source electrode 161 and the drain electrode 162 are portions of the thin film transistors, the display device may further include the plurality of semiconductor layers 120 connected to the electrode pairs. Also, the gate line including the first conductive layers 141 and the second conductive layers 163 alternately arranged may be understood to pass over the semiconductor layers 120.

As used herein, elements being in the same layer as or formed from the same material layer in a method of manufacturing the display device, may collectively define a single layer. In an exemplary embodiment, without being limited thereto, a collective gate layer may include the gate electrode 141, the connection wiring 143 and the step difference adjustor 145. A collective data layer may collectively include the data line DL, the source electrode 161, the drain electrode 162, the bridge wiring 163, the output pad 165, input pad 166 and the end portion 167.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims.

What is claimed is:

1. A display device comprising:
a substrate comprising a display area including pixels at which an image is displayed and a peripheral area at which the image is not displayed, the peripheral area disposed outside the display area; and
in the peripheral area:
a plurality of electrode pairs connected to the pixels in the display area, each of the plurality of electrode pairs comprising a source electrode and a drain electrode spaced apart from each other in a first direction; and
a gate line lengthwise extending in a second direction crossing the first direction, the gate line passing between the source electrode and the drain electrode of each of the plurality of electrode pairs,
wherein the gate line passing between the source electrode and the drain electrode of each of the plurality of electrode pairs comprises:
first conductive layers spaced apart from each other in the second direction, and
second conductive layers in a layer different from a layer in which the first conductive layers are arranged, the second conductive layers being spaced apart from each other along the second direction, alternately arranged with the first conductive layers along the second direction, and connecting the first conductive layers to each other.

2. The display device of claim 1, further comprising a plurality of semiconductor layers connected to the plurality of electrode pairs.

3. The display device of claim 2, wherein the gate line passing between the source electrode and the drain electrode of each of the plurality of electrode pairs passes over the plurality of semiconductor layers.

4. The display device of claim 1, wherein the source electrode, the drain electrode and the second conductive layers are respective patterns of a same layer on the substrate.

5. The display device of claim 1, wherein
the first conductive layers are separated from and spaced apart from each other along a virtual line extending along the second direction, and
the second conductive layers are separated from and spaced apart from each other along the virtual line.

6. The display device of claim 1, wherein the first conductive layers include first conductive patterns which are respectively formed as one body and connected to each other by a second conductive layer among the second conductive layers, each first conductive pattern extending between at least two sequentially arranged electrode pairs.

7. The display device of claim 1, wherein the second conductive layers include a conductive pattern which is formed as one body and connects at least three first conductive layers of at least three sequentially arranged electrode pairs to each other.

8. The display device of claim 7, wherein the at least three first conductive layers of the at least three sequentially arranged electrode pairs, and the conductive pattern formed as one body, are arranged on a virtual line extending along the second direction.

* * * * *